US009448481B2

(12) United States Patent
Sahouria et al.

(10) Patent No.: US 9,448,481 B2
(45) Date of Patent: Sep. 20, 2016

(54) GENERALIZATION OF SHOT DEFINITIONS FOR MASK AND WAFER WRITING TOOLS

(71) Applicant: Mentor Graphics Corporation, Wilsonville, OR (US)

(72) Inventors: Emile Y. Sahouria, Sunnyvale, CA (US); Steffen Schulze, Sherwood, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/848,187

(22) Filed: Sep. 8, 2015

(65) Prior Publication Data

US 2016/0133458 A1    May 12, 2016

Related U.S. Application Data

(63) Continuation of application No. 13/501,446, filed as application No. PCT/US2010/052410 on Oct. 12, 2010, now Pat. No. 9,134,616.

(60) Provisional application No. 61/250,833, filed on Oct. 12, 2009.

(51) Int. Cl.

| | |
|---|---|
| *G03F 7/20* | (2006.01) |
| *G03F 1/76* | (2012.01) |
| *G03F 1/50* | (2012.01) |
| *B82Y 10/00* | (2011.01) |
| *B82Y 40/00* | (2011.01) |
| *H01J 37/317* | (2006.01) |
| *H01L 21/26* | (2006.01) |
| *H01L 21/027* | (2006.01) |

(52) U.S. Cl.
CPC ............. *G03F 7/2063* (2013.01); *B82Y 10/00* (2013.01); *B82Y 40/00* (2013.01); *G03F 1/50* (2013.01); *G03F 1/76* (2013.01); *G03F 7/2045* (2013.01); *G03F 7/70466* (2013.01); *H01J 37/3174* (2013.01); *H01L 21/0274* (2013.01); *H01L 21/26* (2013.01)

(58) Field of Classification Search
CPC .......... G03F 1/50; G03F 1/76; G03F 7/2045; G03F 7/2063; G03F 7/70466; H01L 21/0274; H01L 21/26; H01J 37/3174; B82Y 10/00; B82Y 40/00
USPC ................................ 430/5, 30, 311, 319, 320
See application file for complete search history.

(56) References Cited

U.S. PATENT DOCUMENTS

| | | | | |
|---|---|---|---|---|
| 4,914,304 | A | 4/1990 | Koyama | |
| 5,349,197 | A * | 9/1994 | Sakamoto | B82Y 10/00 250/492.22 |
| 5,830,612 | A | 11/1998 | Yamada et al. | |
| 2008/0054196 | A1 | 3/2008 | Hiroshima | |

FOREIGN PATENT DOCUMENTS

| | | |
|---|---|---|
| JP | 63-114125 | 5/1988 |
| JP | 05-198483 | 8/1993 |
| JP | 09-259804 | 10/1997 |
| JP | 11-238660 | 8/1999 |
| JP | 2008-066441 | 3/2008 |

OTHER PUBLICATIONS

Machine English-language translation of Japanese Patent Publication No. 11-238660 to Toshiba Corp., published Aug. 31, 1999.
"Best depth of focus on 22 nm logic wafers with less shot count," by Fujimura et al., Photomask and Next-Generation Lithography Mask Technology XVII, Proc. of SPIE vol. 7748, SPIE 2010.
"Cell projection EB exposure for Giga DRAM device mask," by Shin et al., Proc. of SPIE vol. 5256, SPIE 2003.
"Charged Particle Multi-Beam Lithography Evaluations for sub-16nm hp Mask Node Fabrication and Wafer Direct Write," by Platzgummer et al., Photomask Technology, Proc. of SPIE vol. 7488, SPIE 2009.
"Electron Beam Mask Writer EBM-7000 for Hp 32nm Generation," by Kamikubo et al., Photomask Technology, Proc. of SPIE vol. 7488, SPIE 2009.
"Evaluation of maskless electron beam direct writing with double character projection apertures," by Midoh et al., Alternative Lithographic Technologies II, Proc. of SPIE vol. 7637, SPIE 2010.
"Evaluation of Throughput Improvement by MCC and CP in Multicolumn E-beam Exposure System," by Yamada et al., Alternative Lithographic Technologies II, Proc. of SPIE vol. 7637, SPIE 2010.
"Experimental Result and Simulation Analysis for the use of Pixelated Illumination from Source Mask Optimization for 22nm Logic Lithography Process," by Lai et al., Optical Microlithography XXII, Proc. of SPIE vol. 7274, SPIE 2009.
"Metrics to Assess Fracture Quality for Variable Shaped Beam Lithography," by Bloecker et al., Photomask Technology 2006, Proc. of SPIE vol. 6349, SPIE 2006.
"Writing strategy and electron-beam system with an arbitrarily shaped beam," by Sergey Babin, 24th Annual BACUS Symposium on Photomask Technology, Proc of SPIE vol. 5567, SPIE 2004.

* cited by examiner

*Primary Examiner* — Christopher Young
(74) *Attorney, Agent, or Firm* — Plumsea Law Group, LLC

(57) ABSTRACT

Techniques for reducing the number of shots required by a radiation beam writing tool to write a pattern, such as fractured layout design, onto a substrate. One or more apertures are employed by a radiation beam writing tool to write a desired pattern onto a substrate using L-shaped images, T-shaped images, or some combination of both. By reducing the number of shots required to write a pattern onto a substrate, various implementations of the invention may reduce the write time and/or write complexity of the write process.

20 Claims, 9 Drawing Sheets

GENERALIZATION OF SHOT DEFINITIONS FOR MASK AND WAFER WRITING TOOLS

RELATED APPLICATIONS

This application is a continuation application of U.S. patent application Ser. No. 13/501,446, filed under 35 U.S.C. §371(c) on Dec. 4, 2012, entitled "Generalization Of Shot Definitions For Mask And Wafer Writing Tools," and naming Emile Y. Sahouria et al. as inventors, which application in turn is a national stage application under 35 U.S.C. §371 of International Patent Cooperation Treaty Application No. PCT/US2010/052410 filed on Oct. 12, 2010, entitled "Generalization Of Shot Definitions For Mask And Wafer Writing Tools," and naming Emile Y. Sahouria et al. as inventors, which international application in turn claimed priority to U.S. Provisional Patent Application No. 61/250,833, entitled "L-Shaped E-Beam Exposure," filed on Oct. 12, 2009, and naming Emile Y. Sahouria as inventor, each of which applications are incorporated entirely herein by reference.

FIELD OF THE INVENTION

The present invention is directed to the use of radiation beams to write patterns onto a substrate, such as a photolithographic mask blank or a semiconductor device wafer. Various implementations of the invention may be particularly useful for reducing the amount of time required to write a desired pattern onto a substrate.

BACKGROUND OF THE INVENTION

Microdevices, such as integrated electronic circuits and microelectromechanical system (MEMS) are used in a variety of products, from automobiles to microwaves to personal computers. Designing and fabricating microdevices typically involves many steps, known as a "design flow." The particular steps of a design flow often are dependent upon the type of microcircuit being designed, its complexity, the design team, and the microcircuit fabricator or foundry that will manufacture the microcircuit. For example, if the microdevice is a complex integrated circuit, then various software and hardware "tools" typically will be used to verify the device's design prior to manufacture, to confirm that the manufactured circuit will operate as intended.

During the microdevice design flow process, a physical design for the device will be created describing the specific geometric elements that will make up the device. This type of design often is referred to as a "layout" design. For example, if the microdevice is an integrated circuit, then the geometric elements will define the shapes that will be created in various materials to actually manufacture the circuit device components (e.g., contacts, gates, interconnect lines, etc.) making up the circuit. While the geometric elements may have any desired shapes, such as circular and elliptical shapes, they typically will be polygons. Layout tools (often referred to as "place and route" tools), such as Mentor Graphics' IC Station or Cadence's Virtuoso, are commonly used for both of these tasks.

After the layout design has been finalized, it is converted into a format that can be employed to manufacture the microdevice. For example, the microdevice may be manufactured using a photolithographic manufacturing process. With this manufacturing process, the layout design data will be converted into a format that can be used by a mask writing tool to create a mask for use in a photolithographic manufacturing process. Masks are typically made using tools that expose a blank mask substrate to a beam of radiation, such as an electron or laser beam, to create opaque, translucent or transparent patterns. Alternately, the microdevice may be manufactured by using a beam of radiation to directly write patterns onto a device substrate, by, for example, energizing portions of a resist material formed over the substrate's surface prior to an etching process. With this type of direct-write manufacturing process, the layout design data similarly will be converted into a format that can be used by a radiation beam tool to write the desired patterns onto a substrate.

Most radiation beam writing tools are able to only write certain kinds of polygons, however, such as right triangles, rectangles or other trapezoids. Moreover, the sizes of the polygons are limited physically by the maximum beam aperture size available to the radiation beam writing tool. Accordingly, larger geometric elements in a layout design, or geometric elements that are not basic right triangles, rectangles or trapezoids (which typically is a majority of the geometric elements in a layout design) are "fractured" into smaller, more basic "atomic" polygons that can be written by radiation beam writing tool. Typically, these atomic polygons will be rectangles. Once the layout design has been fractured into atomic shapes, the layout design data can be converted to a format compatible with a particular radiation beam writing tool. Examples of such formats are MEBES, for raster scanning machines manufactured by ETEC, an Applied Materials Company, the ".MIC" format from Micronics AB in Sweden, and various vector scan formats for Nuflare, JEOL, and Hitachi machines, such as VSB12 or VSB12.

With conventional radiation beam writing tools, each atomic shape may be formed with a single beam exposure through one or more apertures that are configured for the desired atomic shape. This exposure is often referred to as a "shot." The operating time of radiation beam writing tool typically will be proportional to the number of shots required to write the desired pattern. Accordingly, as microdevice designs become more complex, the amount of time required to create a photolithographic mask or manufacture a microdevice using a direct-writing technique has increased. Further, with photolithographic manufacturing, some resolution enhancement techniques used to improve the manufacturing process, such as optical process correction (OPC), have dramatically increased the number of atomic shapes in fractured layout designs. As a result, creating a set of photolithographic masks required to manufacture an integrated circuit microdevice may cost millions of dollars.

BRIEF SUMMARY OF THE INVENTION

Aspects of the invention relate to techniques for reducing the number of shots required by a radiation beam writing tool to write a pattern, such as fractured layout design, onto a substrate. According to various implementations of the invention, one or more apertures are employed by a radiation beam writing tool to write a desired pattern onto a substrate using L-shaped images, T-shaped images, or some combination of both. For example, some implementations of the invention may analyze the atomic shapes in a pattern to identify adjacent rectangular atomic shapes that can be combined into an L-shape or a T-shape. The radiation beam writing tool can then write these atomic shapes onto a substrate in a single shot by forming an image on the substrate corresponding to the L-shape or T-shape. By reducing the number of shots required to write a pattern onto a substrate, various implementations of the invention may reduce the write time and/or write complexity of the write process.

DETAILED DESCRIPTION OF THE INVENTION

Overview

Figure 1:
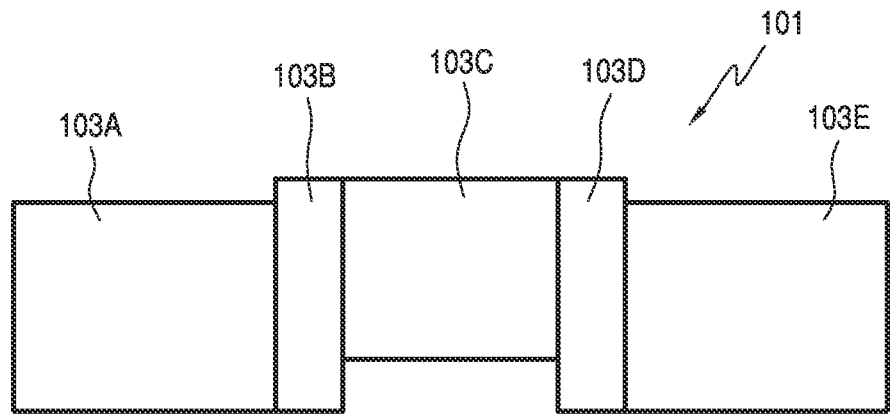
FIG. 1 illustrates an example of a pattern segment that has been divided into rectangular atomic shapes.
Figure 2:
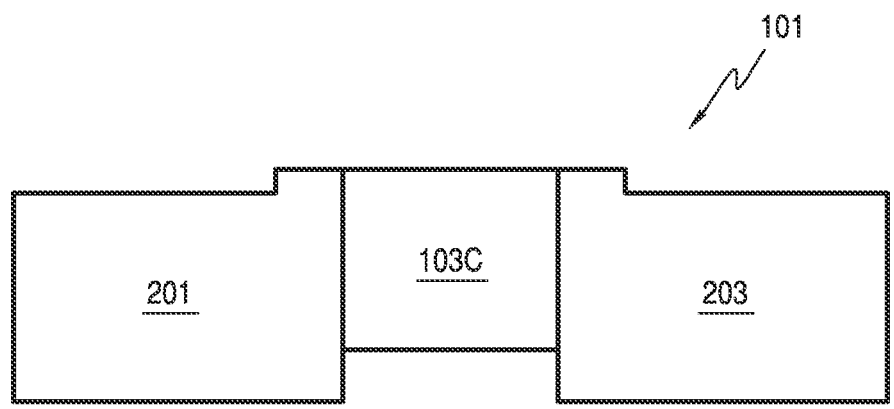
FIG. 2 illustrates the pattern segment shown in FIG. 1 using a combination of L-shapes and rectangular shapes according to various examples of the invention.

FIG. 1 illustrates an example of a pattern segment 101 that has been divided into rectangular atomic shapes 103A-103E. As will be appreciated by those of ordinary skill in the art, the pattern segment 101 is representative of many pattern segments that may be found in a physical microdevice design, such as a layout design for an integrated circuit. As previously noted, each of the atomic shapes 103A-103E are rectangular, as is typical for conventional radiation beam writing tools. As will be explained in more detail below, various examples of the invention represent patterns to be written onto a substrate using one or more L-shapes, one or more T-shapes, or some combination thereof. For example, FIG. 2 illustrates the pattern 101 according to various examples of the invention by using a combination of L-shapes and rectangular shapes. More particularly, as seen in this figure, the rectangular atomic shape 103A and the rectangular atomic shape 103B have been combined into a single L-shape 201, while the rectangular atomic shape 103D and the rectangular atomic shape 103E have been combined into a single L-shape 203.

Figure 3:
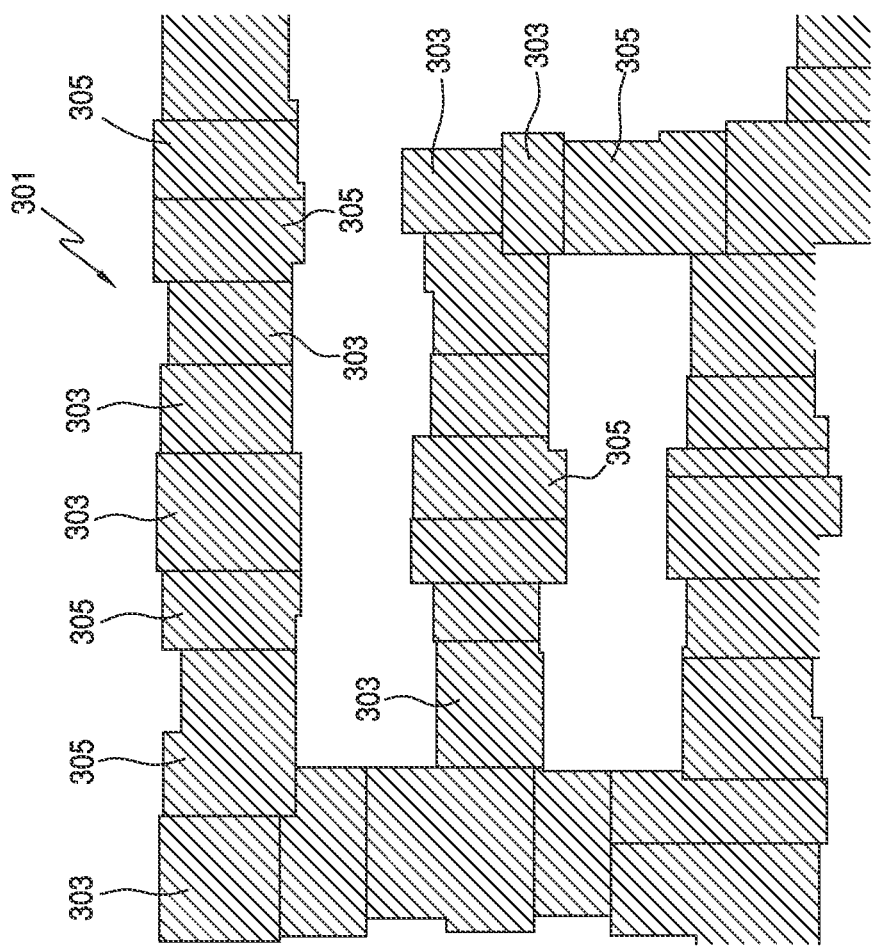
FIG. 3 illustrates a larger pattern segment than the pattern segment illustrated in FIG. 1
Figure 3:
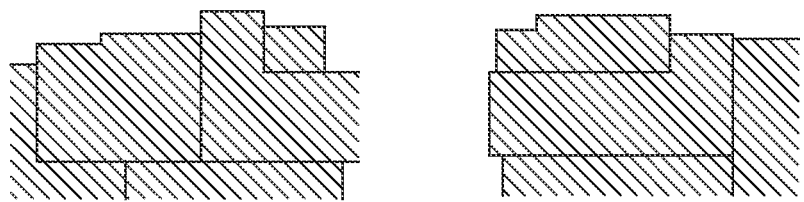

As will also be discussed in more detail below, various implementations of the invention provide radiation beam writing tools that can easily project an L-shaped image or a T-shaped image onto a substrate. Thus, by employing a radiation beam writing tool configured to write L-shaped images onto a substrate, the pattern segment 101 can be written according to various implementations of the invention using only three shots corresponding to the shapes 102C, 201 and 203 shown in FIG. 1 (i.e., a shot reduction of 40%). FIG. 3 illustrates a larger pattern segment 301, which also is representative of many pattern segments that may be found in a physical microdevice design. As seen in this figure, this larger pattern segment 301 can be divided into a plurality of rectangular shapes 303 and L-shapes 305 that can be written by a radiation beam writing tool according to various examples of the invention.

Radiation Beam Writing Tool

Figure 4:
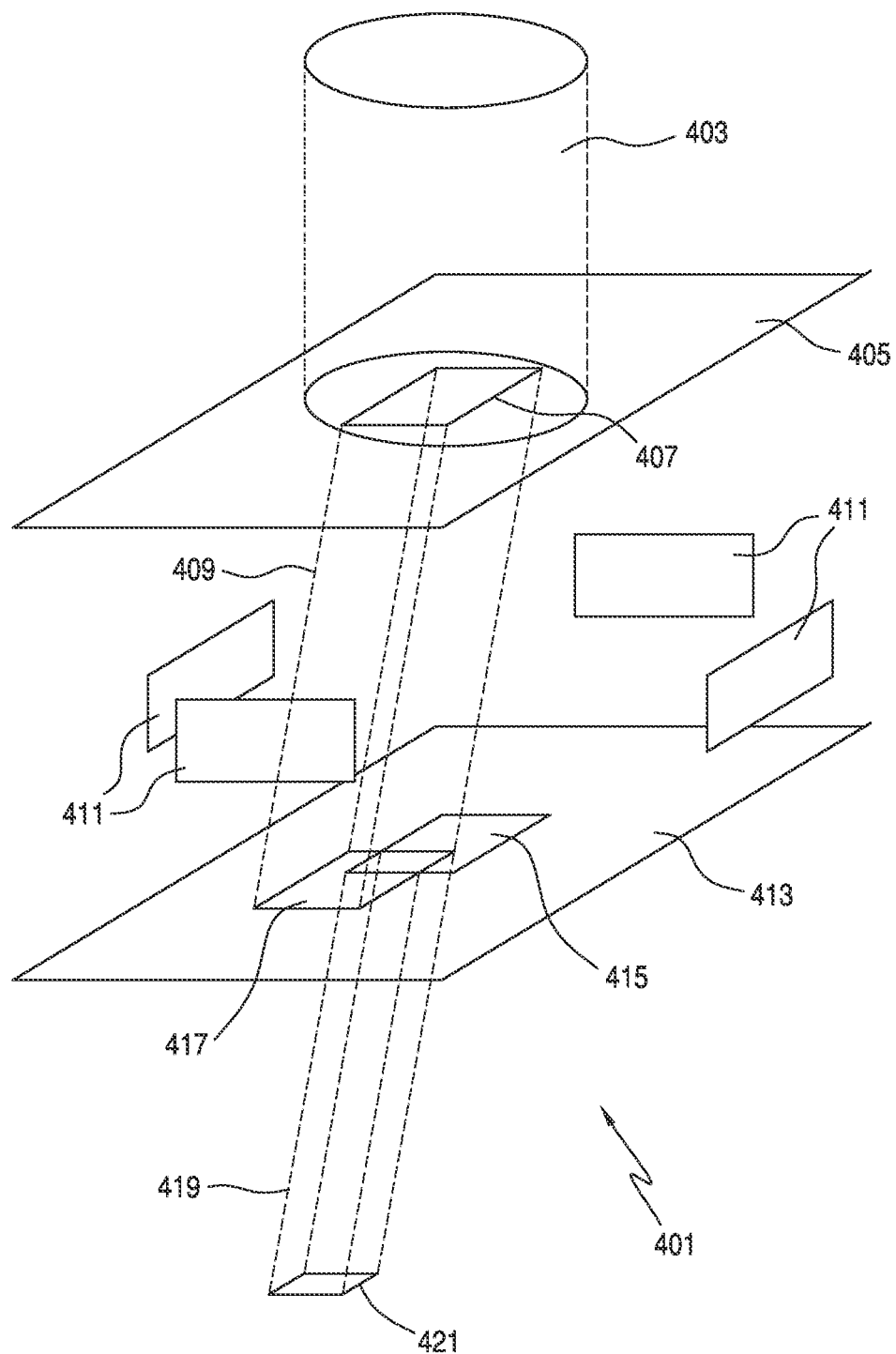
FIG. 4 illustrates an example of a conventional radiation beam writing tool.

FIG. 4 illustrates an example of a conventional radiation beam writing tool 401. Typically, the radiation beam writing tool 401 will include a radiation source (not shown) that produces a beam 403 of radiation. The radiation beam 403 may be a beam of electrons (e.g., for an e-beam writer). The radiation beam 403 also may be a beam of electromagnetic radiation, such as visible light or ultraviolet light (e.g., a laser writer). The radiation beam 403 may be collimated, it may be focused using conventional lensing techniques, or it may employ some combination thereof.

The radiation beam 403 is partially blocked by an aperture platform 405 defining an aperture 407 therethrough. The aperture 407 allows through only a first beam portion 409 of the radiation beam 403. If the radiation beam 403 is an electronic beam, then the direction of the first beam portion 409 is then controlled by a set of electronic deflectors 411. More particularly, the deflectors 411 direct the first beam portion 409 so that some or all of it passes through a second aperture 415 in a second aperture platform 413.

Thus, the first beam portion 409 forms an image 417 on the second aperture platform 413 that partially or fully overlaps the second aperture 415, thereby segmenting a second beam portion 419 that passes through the second aperture 415. This second beam portion 419 forms an image 421 or shot on a substrate (not shown). By directing the first beam portion 409 from the first aperture 407 to the second aperture 415, the deflectors 411 can control the specific shape and size of the image 421 written onto a substrate. Of course, it should be appreciated that other types of radiation beam writing tools may employ different configurations. For example, some radiation beam writing tools might move the first aperture 407 and the second aperture 415 relative to each other, rather than (or in addition to) controlling the direction of the first beam portion 409. Further, those of ordinary skill in the art will appreciate that, if the radiation beam 403 is an electromagnetic radiation beam such as a laser, then the radiation beam writing tool 401 may use a different arrangement to pass the radiation beam 403 through one or more apertures to form the image 421.

As will be appreciated by those of ordinary skill in the art, the apertures 407 and 415 conventionally have opposing parallel edges, which constrain the image 421 to an isothetic trapezoidal shape. Moreover, in a typical microdevice design, shape edges within the design usually are parallel to an x-axis or y-axis of the image coordinate system employed to create the design, thereby requiring the radiation beam writing tool 401 to form rectangular-shaped images 421 in order to write the design. As a result, most conventional radiation beam writing tools relay upon this arrangement to enhance performance.

Radiation Beam Writing Tool for Writing L-Shaped or T-Shaped Images

Figure 5:
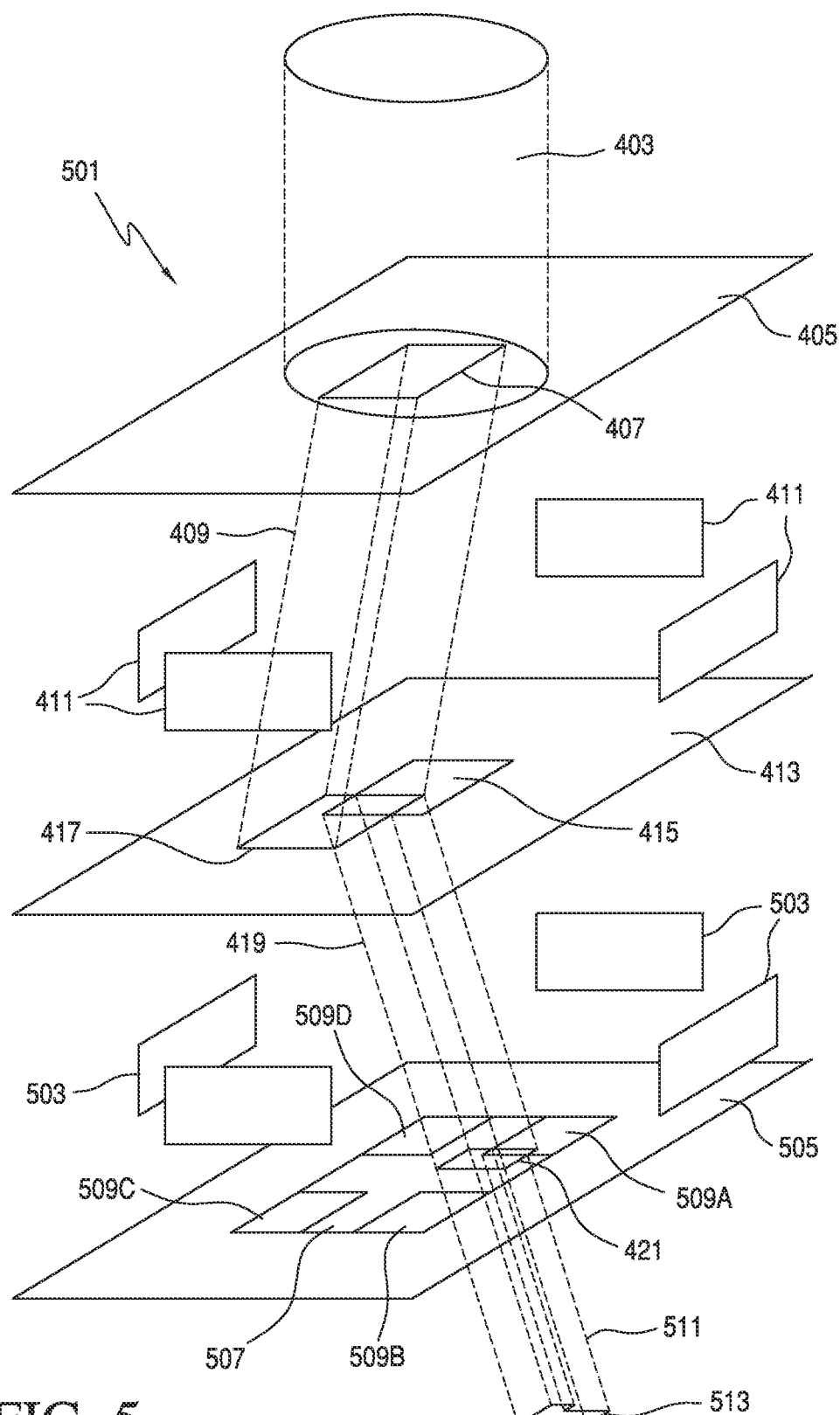
FIG. 5 illustrates an example of a radiation beam writing tool that may be employed to write L-shaped images and T-shaped images according to various examples of the invention.

FIG. 5 illustrates an example of a radiation beam writing tool 501 that may be employed to write L-shaped images and T-shaped images according to various examples of the invention. The radiation beam writing tool 501 may generally include the major components of the radiation beam writing tool 401, such as a radiation source (not shown) that produces a beam 403 of radiation. The radiation beam 403 may be a beam of electrons (e.g., for an e-beam writer). The radiation beam 403 also may be a beam of electromagnetic radiation, such as visible light or ultraviolet light (e.g., a laser writer). The radiation beam 403 may be collimated, it may be focused using conventional lensing techniques, or it may employ some combination thereof. As seen in FIG. 5, the radiation beam writing tool 501 also will include the first aperture platform 405 defining the first aperture 407, the deflectors 411, and the second aperture platform 413 defining the second aperture 415.

In addition, the radiation beam writing tool 501 further includes a second set of electronic deflectors 503 and a third aperture platform 505 defining a third aperture 507 therethrough. As show in FIG. 5, the aperture platform 505 includes four aperture tabs 509A-509C sized and positioned to provide the aperture 507 with a symmetric T-shape. As used herein, the terms "T-shape," "t-shape" and other variations will broadly refer to a generic category of shapes having one substantially straight portion orthogonally intersect or pass through another substantially straight portion. Thus the terms "Tshape," "t-shape" and other variations will encompass all of the following general shapes: T, ⊢, ⊣, and ⊥.

In operation the electronic deflectors 503 will direct the second beam portion 419 so that some or all of it passes through the third aperture 507 in the third aperture platform 505. Thus, the second beam portion 409 forms the image 421 on the aperture platform 505 so that the image 421 partially or fully overlaps the aperture 507, thereby segmenting a third beam portion 511 that passes through the third aperture 507. This third beam portion 511 forms an image 513 on a substrate (not shown).

As previously noted, the aperture 507 has a t-shape. By directing the second beam portion 409 through the t-shaped aperture 507, the deflectors 503 can control the specific shape and size of the image 421 written onto a substrate. More particularly, if the deflectors 503 direct the second beam portion 409 onto the aperture 507 so that some of the second beam portion 409 is blocked by a single aperture tab 509, then the image 513 created by the third beam portion 511 will have an L-shape. For example, in FIG. 5, some of the second beam portion 409 is blocked by the aperture tab 509A, causing the image 513 to have an L-shape with the concave region facing up and to the right in the illustration. Moreover, by controlling which areas of the image 513 are blocked by the aperture tab 509, the radiation beam writing tool 501 can adjust the width and length of each of the portions in the L-shape.

Similarly, if the deflectors 503 direct the second beam portion 409 onto the aperture 507 so that some of the second beam portion 409 is blocked by a two or four aperture tabs 509, then the image 513 created by the third beam portion 511 will have an T-shape. If some of the second beam portion 409 is blocked by only two aperture tabs 509, then the image will have a T, ⊢, or ⊣ shape. If some of the second beam portion 409 is blocked by all four aperture tabs 509, then the image will have a + shape. Again, by controlling which areas of the image 513 are blocked by the aperture tab 509, the radiation beam writing tool 501 can adjust the width and length of each of the portions in the t-shape. Of course, by directing the second beam portion 409 onto the aperture 507 so that none of the second beam portion 409 is blocked by an aperture tab 509, then the image 513 created by the third beam portion 511 will have an rectangular shape (i.e, either a rectangle or a square, depending upon the area of the first beam portion blocked by the second aperture 415.

In this manner, the radiation beam writing tool 501 can form a variety of t-shaped images, L-shaped images, and rectangular images to use as shots in writing a pattern onto a substrate. Of course, further implementations of the radiation beam writing tool 501 may employ additional features to enhance the range of producible shapes. For example, some implementations of the radiation beam writing tool 501 may provide adjustable aperture tabs 509 that can be lengthened, broadened, or both, so as to provide greater variety in the range of possible lengths and widths of the legs in L-shaped and t-shaped images.

Figure 6:
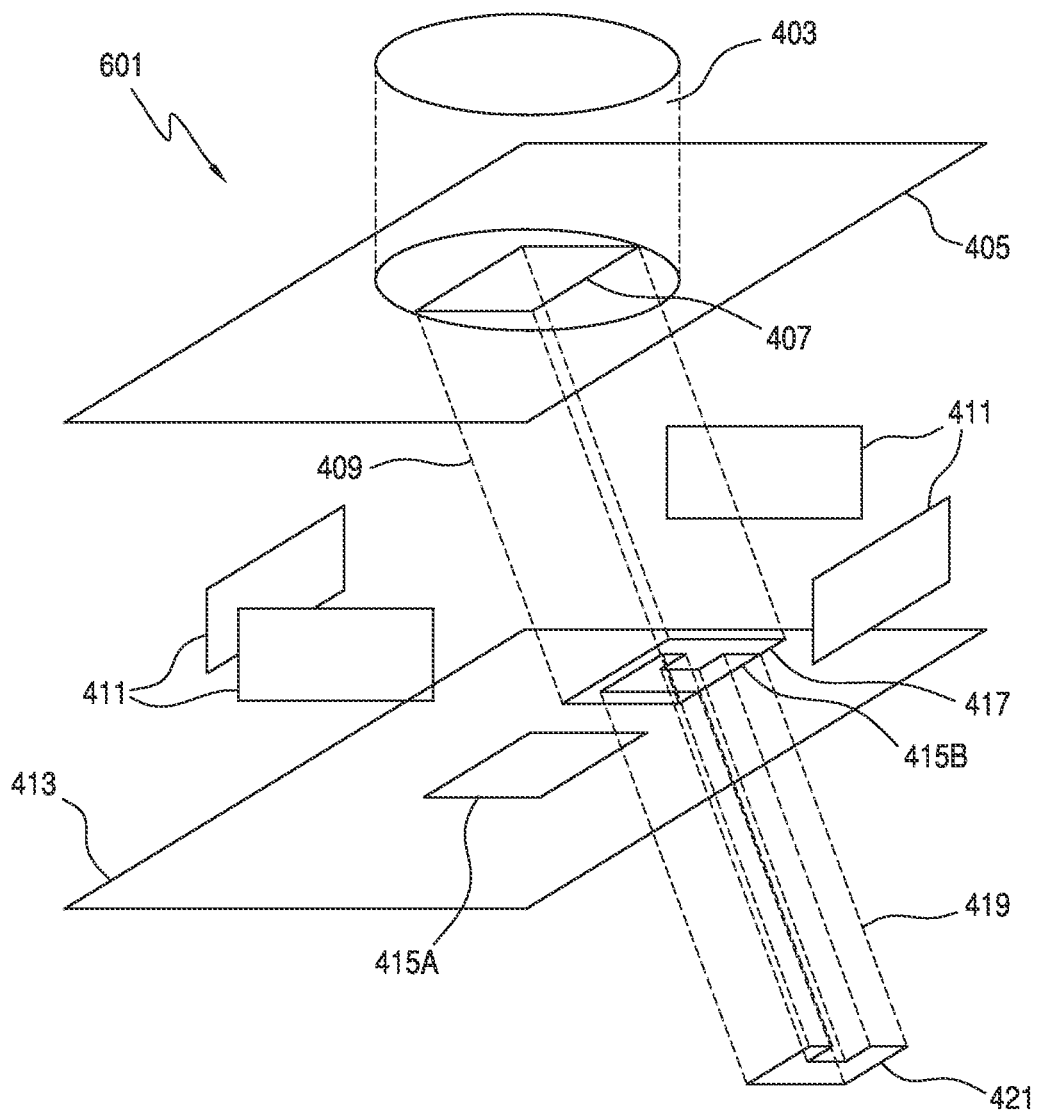
FIG. 6 illustrates another example of a radiation beam writing tool that may be employed to write L-shaped images and T-shaped images according to various examples of the invention.
Figure 7:
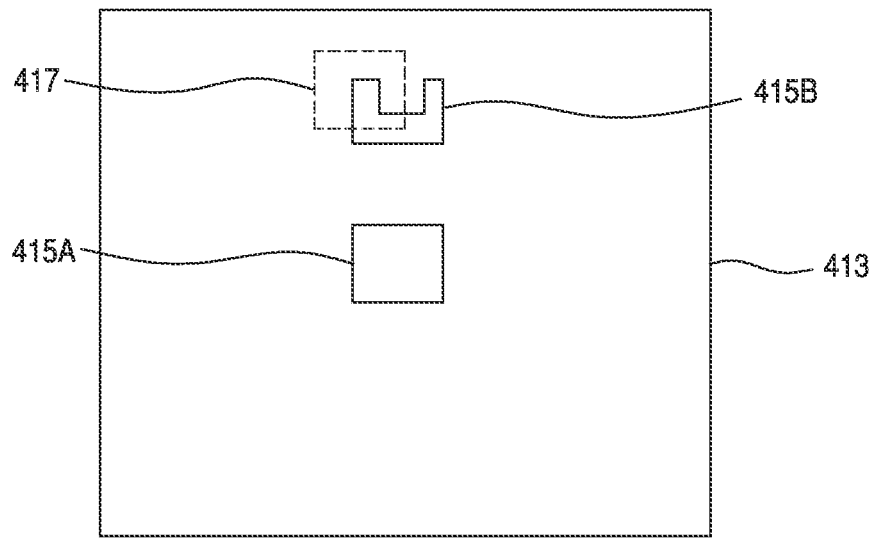
FIG. 7 illustrates the second aperture platform shown in FIG. 6.

FIG. 6 illustrates another example of a radiation beam writing tool 601 that may be employed to write L-shaped images and T-shaped images according to various examples of the invention. Like the radiation beam writing tool 501, the radiation beam writing tool 601 may generally include the major components of the radiation beam writing tool 401, such as a radiation source (not shown) that produces a beam 403 of radiation. The radiation beam 403 may be a beam of electrons (e.g., for an e-beam writer). The radiation beam 403 also may be a beam of electromagnetic radiation, such as visible light or ultraviolet light (e.g., a laser writer). The radiation beam 403 may be collimated, it may be focused using conventional lensing techniques, or it may employ some combination thereof. As seen in FIG. 6, however, the second aperture platform 413 defines a plurality of apertures 415 with different shapes. For example, in the illustrated implementation, the second aperture platform defines a rectangular aperture 415A and an irregularly shaped aperture 415B. As shown in more detail in FIG. 7, the irregularly shaped aperture 415B has a plurality of orthogonal legs of different widths and lengths. Accordingly, by controlling the first beam portion 409 so that the image 417 overlaps different regions of the irregularly shaped aperture 415B, the radiation beam writing tool 601 can vary the shape of the second beam portion 419 and the resulting image 421 that is written onto the substrate (not shown). By providing multiple apertures 415 with a variety of different irregular shapes, the radiation beam writing tool 601 will allow a user to create an even wider variety of shapes for the image 421.

Figure 8:
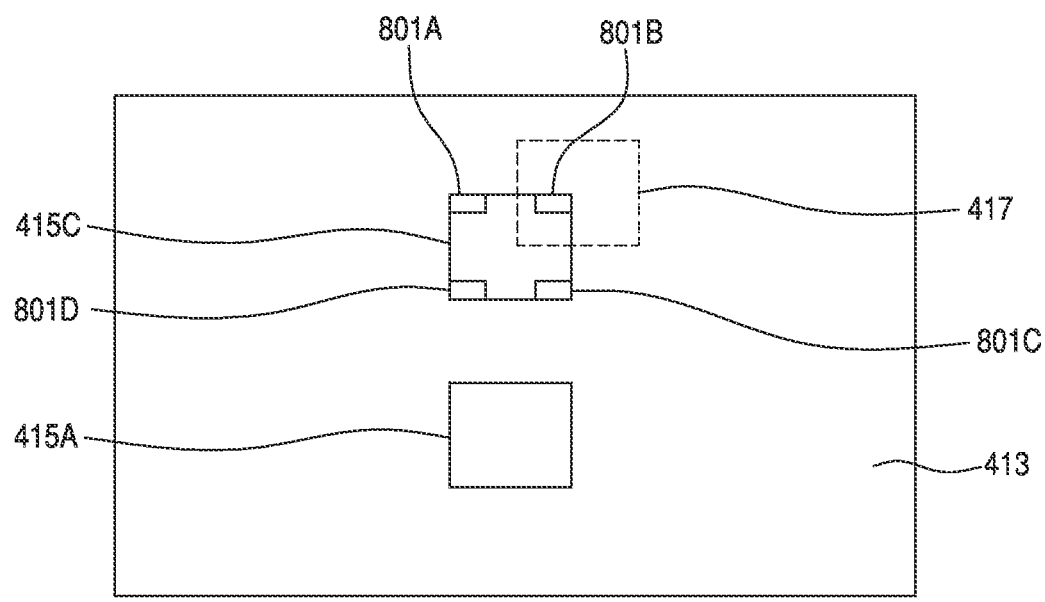
FIG. 8 illustrates another example of apertures that may be employed in the radiation beam writing tool shown in FIG. 6 according to various examples of the invention.

FIG. 8 illustrates yet another example of a second aperture platform 413 that may be employed with the radiation beam writing tool 601. As seen in this figure, the second aperture platform 413 includes an aperture 415C with four aperture tabs 801A-801C. As with the aperture 509 illustrated in FIG. 5 discussed above, the aperture tabs 801 provide the aperture 415C with a symmetric t-shape. As also previously discussed with respect to the implantation shown in FIG. 5, the deflectors 411 can be used to determine how much of the image 417 overlaps with one or more of the aperture tabs 801, thereby controlling whether the second beam portion 419 and the resultant image 421 have an L-shape, a T-shape, a ⊢ shape, a ⊣-shape, or a +-shape. Further, various implementations of the radiation beam writing tool 601 may provide a plurality of apertures 415C, each with a different width and/or length for one or more of the aperture tabs 801. For example, some implementations of the invention may provide a multiple series of apertures 415C where the length of each aperture tab 801 increases by, e.g., 1 nanometer from each series to each series. Each series may then contain multiple apertures 415C where the width of each aperture tab 801 increases by, e.g., 1 nanometer from an aperture 415C to the next aperture 415C in the series. In this way, the plurality of apertures 415C will allow the radiation beam writing tool 601 to write the image 421 in a wide variety of L-shapes and t-shapes.

Pattern Generation

Figure 9:
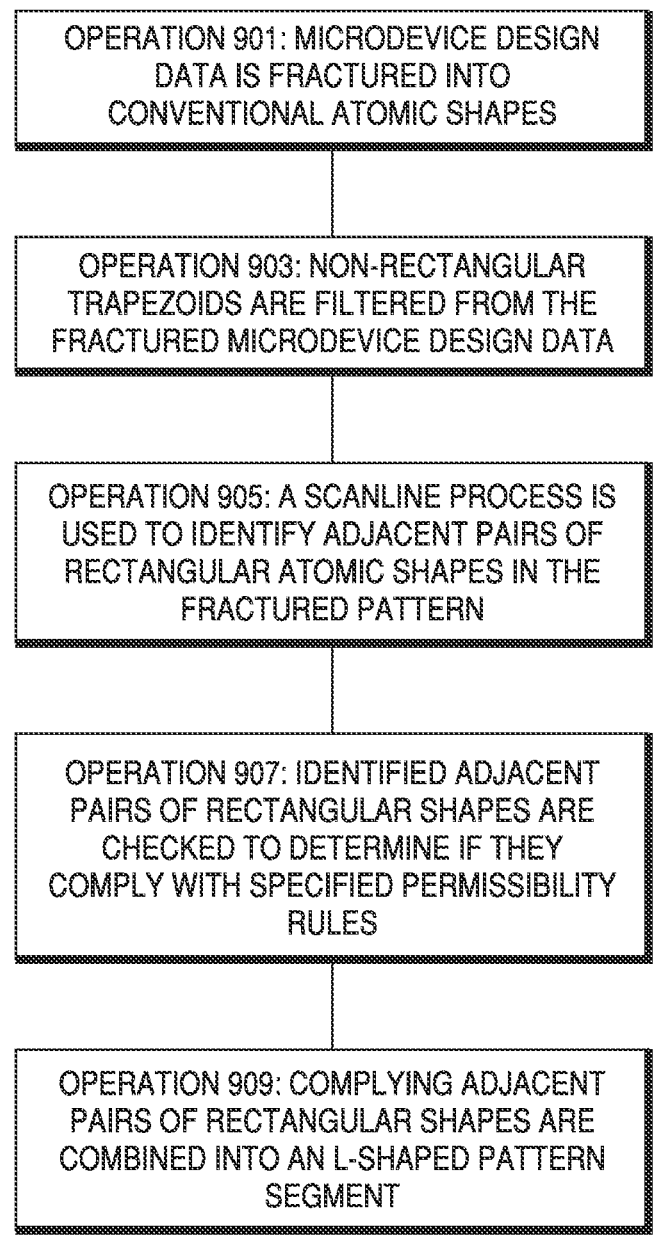
FIG. 9 illustrates the generation of a pattern made up of rectangular shapes and L-shapes that may be employed according to various examples of the present disclosure.

As discussed in detail above, various implementations of the invention allow a radiation beam writing tool to write a pattern onto a substrate using a combination of rectangularly-shaped shots, L-shaped shots, and t-shaped shots. The generation of a pattern made up of rectangular shapes and L-shapes that may be employed according to various examples of the invention will now be discussed with regard to the method shown in the flowchart shown in FIG. 9.

Initially, in operation 901, microdevice design data is fractured into conventional atomic shapes. With various implementations of the invention, this fracturing process may be performed by a fracturing module in a pattern generation tool according to various implementations of the invention. Alternately, some or all of the microdevice design data can be fractured into conventional atomic shapes by a separate fracturing tool, and provided to a pattern generation tool according to various implementations of the invention from an outside source. As will be appreciated by those of ordinary skill in the art, conventional microdevice design data fracturing processes are well known in the art, and will not be discussed in further detail.

Next, in operation 903, non-rectangular trapezoids are filtered from the fractured microdevice design data. Again, this operation may be performed by a filtering module in a pattern generation tool according to various implementations of the invention. Alternately, some or all of the non-rectangular shapes may be filtered from the fractured microdevice design data by a separate filtering tool, and some or all of the filtered, fractured microdevice design data may be provided to a pattern generation tool according to various implementations of the invention from an outside source.

In operation 905, a scanline module in a pattern generation tool according to various implementations of the invention uses a scanline process to identify adjacent pairs of rectangular atomic shapes in the fractured pattern. Then, in operation 907, a pair identification module in a pattern generation tool according to various implementations of the invention identifies adjacent pairs of rectangular shapes are checked to determine if they comply with specified permissibility rules.

As will be appreciated by those of ordinary skill in the art, in the "fracturing" operation for variable-shaped beam mask writing, the creation of narrow trapezoids with one or more long sides coincident with the target shape edge are avoided. With various implementations of the invention, the same criterion is applied in creating L-shaped images in the pattern to be written to a substrate. The underlying physical effect implies an additional requirement, however, as exposed energy is less in features narrower than some characteristic width. In a conventional fracturing process, this can be addressed by the rule mentioned above or by dose or exposure time adjustment. With an L-shaped shot having one narrow leg and one wide leg, however, the disparity cannot be easily corrected. One leg will suffer reduced or too much written energy density.

To ensure uniform intensity of exposure of an entire L-shot, a pattern generation tool according to various implementations of the invention may employ a constraint to control the width of the legs of an L-shaped shot. Specifically, with some implementations, given a parameter 's', neither leg may be both narrower than and longer than s. The value of s is usually the "small value" parameter used to characterize narrow trapezoids in conventional fracture. Further, the entire L-shot is constrained to fit within a square whose side length is the maximum shot size for the mask writer.

These constraints on the designation of L-shots are similar to those used with cell-projection apertures. Both exhibit concave corners and substantial complexity confined to a local spatial extent. Accordingly, those of ordinary skill in the art will appreciate that any compensation or correction techniques used for cell projection may also apply to various implementations of the invention.

Forming an L-shot should take no longer than the formation of a rectangular or trapezoidal shot, since the times to control the two deflectors overlap. An additional high-speed data channel is required in order to drive the new deflector. Each L-shot imparts the exposure of two rectangular shots, however; i.e., each L-shot eliminates a conventional fracture shot. In addition, if one of the rectangular shots was narrow, then extra exposure time or dose may also be obviated. Thus, various implementations of the invention provide the ability to print small corner notches that would normally be considered a less than ideal feature.

Conventional trapezoidal exposure in a shaped-beam writer has a well understood model of the error for each shot. The shaping deflector between the two shaping apertures will suffer some errors 'e' in each dimension (assumed isotropic for simplicity), respectively, which make the width and height of the shot random variables. The placement deflectors and stage positioning error then create placement errors 'pl' in each dimension.

Figure 10:
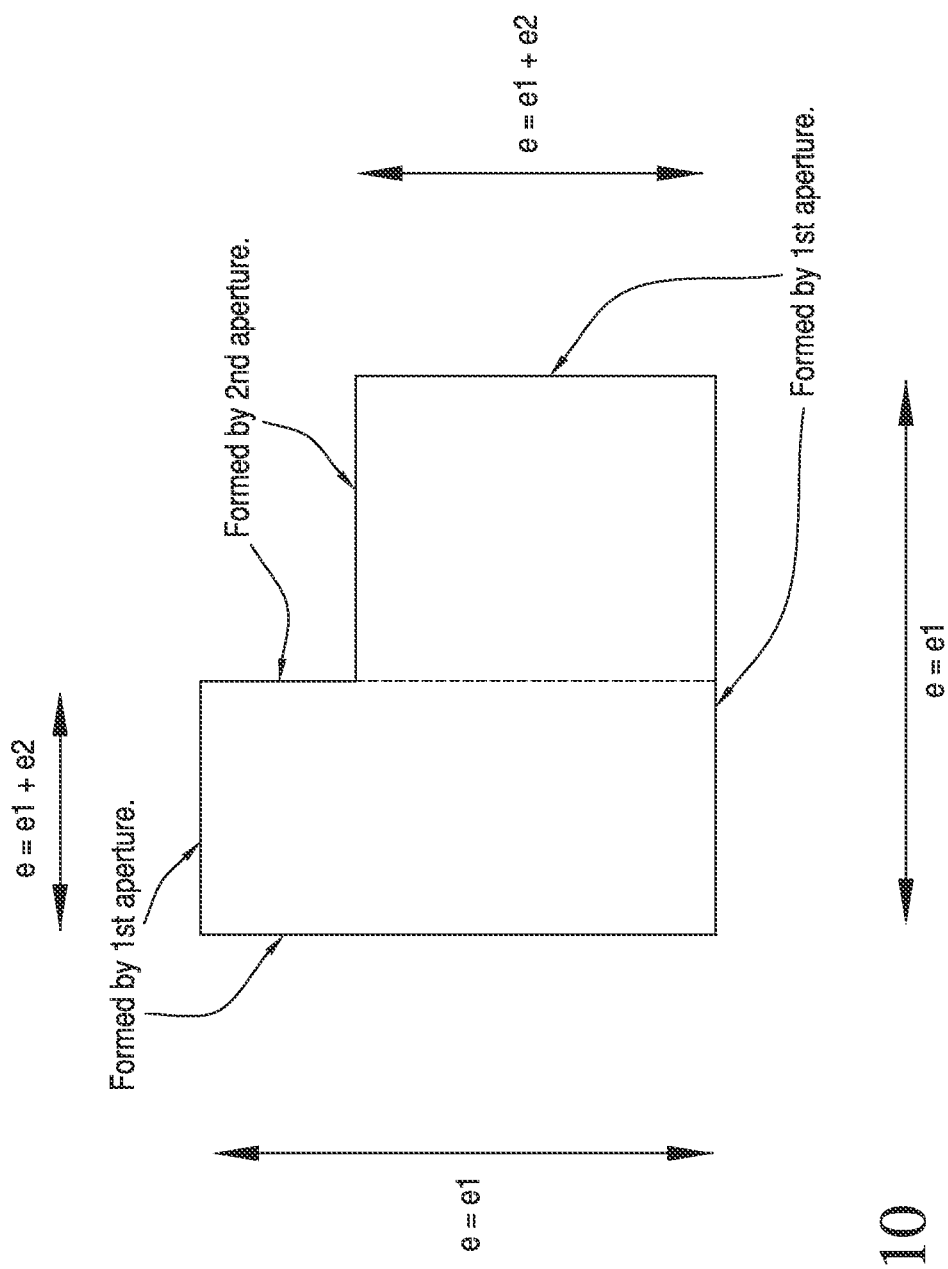
FIG. 10 illustrates an error model for a L-shot exposure.

The error model for L-shot exposure is more complicated, as illustrated in FIG. 10. Two deflectors are used in shaping, resulting in shaping errors 'e1' and 'e2'. Placement error is unchanged, since the relevant apparatus is unchanged. In the figure one sees that some errors are compounded while others are reduced. For instance, the dimensions between a 'notch' edge and the opposite edge are now sums of two independent random variables. But the dimensions between "end" edges and their opposites are now single random variables, as opposed to being sums of two random variables in the conventional case, and the shared "end" edge is now formed by a single aperture in one exposure. In any case, the major component of shot edge error—the placement error—is unchanged between the new method and trapezoidal exposure.

Lastly, in operation 909, pairs of adjacent rectangles that comply with the relevant permissibility rules are combined in the pattern. In this manner, a conventional fractured pattern can be converted to atomic shot shapes that can be employed by a beam writing tool according to various implementations of the invention. Further, while implementations of pattern generating tools were described above with respect to L-shaped shots, it should be appreciated that the relevant techniques and criteria could likewise be employed according to various embodiments of the invention to generate patterns with additional or alternate t-shaped shots.

Exemplary Operating Environment

Figure 11:
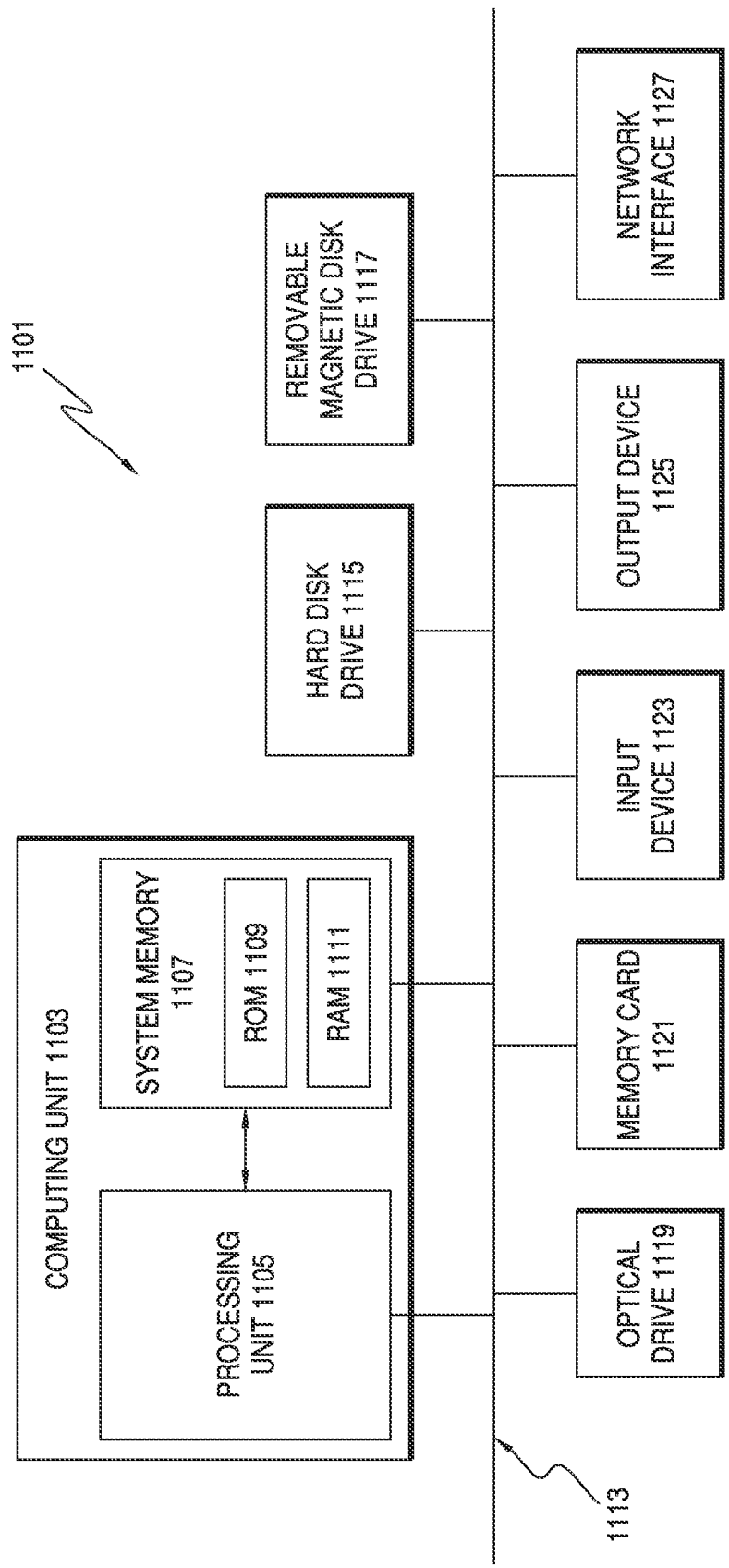
FIG. 11 illustrates an example of a computing device.

The execution of various pattern generating processes according to embodiments of the invention described may be implemented using computer-executable software instructions executed by one or more programmable computing devices, by one or more computers executing software instructions, by software instructions for programming one or more computers stored on a non-transitory computer-readable medium, or some combination thereof. Various examples of the invention may be implemented through the execution of software instructions by a computing device, such as a programmable computer. Accordingly, FIG. 11 shows an illustrative example of a computing device 1101. As seen in this figure, the computing device 1101 includes a computing unit 1103 with a processing unit 1105 and a system memory 1107. The processing unit 1105 may be any type of programmable electronic device for executing software instructions, but will conventionally be a microprocessor. The system memory 1107 may include both a read-only memory (ROM) 1109 and a random access memory (RAM) 1111. As will be appreciated by those of ordinary skill in the art, both the read-only memory (ROM) 1109 and the random access memory (RAM) 1111 may store software instructions for execution by the processing unit 1105.

The processing unit 1105 and the system memory 1107 are connected, either directly or indirectly, through a bus 1113 or alternate communication structure, to one or more peripheral devices. For example, the processing unit 1105 or the system memory 1107 may be directly or indirectly connected to one or more additional memory storage devices, such as a "hard" magnetic disk drive 1115, a removable magnetic disk drive 1117, an optical disk drive 1119, or a flash memory card 1121. The processing unit 1105 and the system memory 1107 also may be directly or indirectly connected to one or more input devices 1123 and one or more output devices 1125. The input devices 1123 may include, for example, a keyboard, a pointing device (such as a mouse, touchpad, stylus, trackball, or joystick), a scanner, a camera, and a microphone. The output devices 1125 may include, for example, a monitor display, a printer and speakers. With various examples of the computer 1101, one or more of the peripheral devices 1115-125 may be internally housed with the computing unit 1103. Alternately, one or more of the peripheral devices 1115-125 may be external to the housing for the computing unit 1103 and connected to the bus 1113 through, for example, a Universal Serial Bus (USB) connection.

With some implementations, the computing unit 1103 may be directly or indirectly connected to one or more network interfaces 1127 for communicating with other devices making up a network. The network interface 1127 translates data and control signals from the computing unit 1103 into network messages according to one or more communication protocols, such as the transmission control protocol (TCP) and the Internet protocol (IP). Also, the interface 1127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 1101 is illustrated as an example only, and it not intended to be limiting. Various embodiments of the invention may be implemented using one or more computing devices that include the components of the computer 1101 illustrated in FIG. 11, which include only a subset of the components illustrated in FIG. 11, or which include an alternate combination of components, including components that are not shown in FIG. 11. For example, various embodiments of the invention may be implemented using a multi-processor computer, a plurality of single and/or multiprocessor computers arranged into a network, or some combination of both.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of writing patterns onto a substrate, comprising:
   obtaining a set of microdevice design data;
   fracturing the set of microdevice design data into conventional shapes;
   filtering non-rectangular trapezoids from the fractured set of microdevice design data;
   identifying adjacent pairs of rectangular shapes;
   combining adjacent pairs of rectangular shapes into pattern segments;
   projecting a beam of radiation through at least one aperture onto a substrate; and
   arranging the beam of radiation relative to the at least one aperture to form a plurality of images on the substrate according to the pattern segments, such that:
   at least a portion of the images have compound-trapezoidal concave shapes; and
   the plurality of images forms a pattern made up of convex trapezoidal shapes.

2. The method recited in claim 1, wherein the compound-trapezoidal concave shapes include compound-rectangular concave shapes.

3. The method recited in claim 2, wherein the compound-trapezoidal concave shapes include L-shapes.

4. The method recited in claim 2, wherein the compound-trapezoidal concave shapes include cross shapes.

5. The method recited in claim 2, wherein the compound-trapezoidal concave shapes include T-shapes.

6. The method recited in claim 1, wherein the substrate is a blank photolithographic mask.

7. The method recited in claim 1, wherein the substrate is a semiconductor device substrate.

8. The method recited in claim 1, wherein the substrate is a microelectromechanical system substrate.

9. The method recited in claim 1, further comprising arranging the beam of radiation relative to at the at least one aperture by
   directing a first portion of the beam of radiation through a first aperture to control sizes of the images, and
   directing a second portion of the beam of radiation through a second aperture to control the shape of the images.

10. A method of writing patterns onto a substrate, comprising:
    obtaining a set of microdevice design data;
    fracturing the set of microdevice design data into conventional shapes;
    filtering non-rectangular trapezoids from the fractured set of microdevice design data;
    identifying adjacent pairs of rectangular shapes;
    combining adjacent pairs of rectangular shapes into pattern segments;
    projecting a beam of radiation through at least one aperture onto a substrate; and
    arranging the beam of radiation relative to the at least one aperture to form a plurality of images on the substrate according to the pattern segments, such that the plurality of images forms a pattern made up of convex trapezoidal shapes.

11. The method recited in claim 10, wherein the method comprises controlling the shape and size of the patterns written onto the substrate by projecting the beam of radiation through a first aperture in a first platform that allows only a first beam portion to pass through the first aperture and forms an image on a second platform that only partially overlaps a second aperture on the second platform and forms an image on a third platform that has a third aperture, and wherein the third aperture platform includes a plurality of aperture tabs sized and positioned to provide the third aperture with a T-shape.

12. The method recited in claim 11, wherein the second aperture platform defines at least one additional aperture in addition to the second aperture, wherein the additional aperture has a plurality of orthogonal legs of different widths and lengths.

13. The method recited in claim 10, wherein the method further comprises identifying adjacent pairs of rectangular atomic shapes.

14. The method recited in claim 13, further comprising checking the adjacent pairs of rectangular atomic shapes to determine if they comply with a pre-specified permissibility rule.

15. The method recited in claim 14, wherein the permissibility rule requires all legs of the pattern to not be narrower in a first direction than a predetermined parameter and to not be longer than the predetermined parameter in a second direction that is orthogonal to the first direction.

16. A method of writing patterns onto a substrate comprising:
fracturing microdevice design data into atomic shapes;
filtering non-rectangular trapezoids from the fractured microwave design data;
identifying adjacent pairs of rectangular atomic shapes in the filtered and fractured microwave design data;
combining the identified adjacent pairs of rectangular atomic shapes to form a pattern;
projecting a beam of radiation through a first aperture in a first aperture platform, through a second aperture in a second aperture platform and through a third aperture in a third aperture platform onto a substrate;
arranging the beam of radiation relative to the first aperture, the second aperture and the third aperture to form a plurality of images on the substrate according to the pattern, such that at least a portion of the images have compound-trapezoidal concave shapes.

17. The method recited in claim 16, further comprising checking the adjacent pairs of rectangular atomic shapes to determine if they comply with a pre-specified permissibility rule.

18. The method recited in claim 16, wherein the compound-trapezoidal concave shapes include L-shapes.

19. The method recited in claim 16, wherein the compound-trapezoidal concave shapes include T-shapes.

20. The method recited in claim 16, wherein the substrate is one of a blank photolithographic mask and a semiconductor device substrate.

* * * * *